(12) United States Patent
Niramarnkarn et al.

(10) Patent No.: US 11,189,575 B1
(45) Date of Patent: Nov. 30, 2021

(54) SPECIALIZED SURFACE MOUNT DEVICE FOR SYMMETRIC HEAT DISTRIBUTION IN PACKAGE

(71) Applicant: QUALCOMM Incorporated, San Diego, CA (US)

(72) Inventors: Supatta Niramarnkarn, Santee, CA (US); Bin Xu, San Diego, CA (US); Wen Yin, Chandler, AZ (US); Yonghao An, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/874,558

(22) Filed: May 14, 2020

(51) Int. Cl.
| | |
|---|---|
| *H01L 23/552* | (2006.01) |
| *H01L 23/66* | (2006.01) |
| *H01L 23/367* | (2006.01) |
| *H01L 23/31* | (2006.01) |
| *H01L 21/56* | (2006.01) |
| *H01L 23/00* | (2006.01) |

(52) U.S. Cl.
CPC .......... *H01L 23/552* (2013.01); *H01L 21/56* (2013.01); *H01L 23/31* (2013.01); *H01L 23/3677* (2013.01); *H01L 23/66* (2013.01); *H01L 24/95* (2013.01)

(58) Field of Classification Search
CPC ... H01L 23/552; H01L 23/31; H01L 23/3677; H01L 23/66; H01L 21/56; H01L 24/95
See application file for complete search history.

(56) References Cited

U.S. PATENT DOCUMENTS

| | | | |
|---|---|---|---|
| 5,371,404 A * | 12/1994 | Juskey | H01L 23/3675 257/659 |
| 8,629,566 B2 * | 1/2014 | Shivkumar | H01L 23/3737 257/778 |
| 2008/0001283 A1 * | 1/2008 | Lee | H01L 25/0657 257/712 |

* cited by examiner

*Primary Examiner* — Peniel M Gumedzoe
(74) *Attorney, Agent, or Firm* — QualComm Incorporated

(57) ABSTRACT

An integrated circuit (IC) package is described. The IC package includes a laminate substrate. The IC package also includes an active die on a surface of the laminate substrate. The IC package further includes fin-based thermal surface mount devices on the surface of the laminate substrate proximate the active die to provide an additional heat dissipation path.

18 Claims, 11 Drawing Sheets

Top View

Side View

SPECIALIZED SURFACE MOUNT DEVICE FOR SYMMETRIC HEAT DISTRIBUTION IN PACKAGE

BACKGROUND

Field

Aspects of the present disclosure relate to integrated circuits and, more particularly, to a specialized surface mount device for symmetric heat distribution in a package.

Background

A three-dimensional (3D) package may contain two or more chips (e.g., integrated circuits (ICs)) stacked so that they occupy less floor space and/or have greater connectivity. Heat dissipation is increasingly problematic for high end chips that use die stacking. In particular, stacking two or more chips may lead to localized thermal hot spots. As the localized thermal hot spots are embedded in the stack-up, this may reduce the ability to cool the hot spots and achieve low junction temperatures. Conventional cooling solutions for achieving low junction temperatures include heat sinks, heat spreaders, and/or improved printed circuit boards. Conventional techniques of simply increasing the size of the heat spreader and/or the heat sink are impractical in small form factor devices (e.g., smartphones).

The design of complex system-on-chips (SoCs) may be affected by communications enhancements, such as fifth generation (5G) communications. For example, an increased number of communication bands are specified for supporting 5G communications. Supporting these additional communication bands involves cramming additional devices in a reduced package size (e.g., a power amplifier module (PAM) package) resulting in high junction temperatures. Unfortunately, performance of complex SoCs designed to support 5G communications may be detrimentally affected by high junction temperatures.

SUMMARY

An integrated circuit (IC) package is described. The IC package includes a laminate substrate. The IC package also includes an active die on a surface of the laminate substrate. The IC package further includes fin-based thermal surface mount devices on the surface of the laminate substrate proximate the active die to provide an additional heat dissipation path.

A method for fabricating symmetric heat distribution thermal surface mount devices in a shielded package is described. The method includes attaching fin-based thermal surface mount devices in vacant areas on a surface of a laminate substrate proximate a power amplifier module. The method also includes depositing a mold compound on the surface of the laminate substrate, the power amplifier module, and the fin-based thermal surface mount devices. The method further includes grinding the mold compound according to a specified Z-height of the shielded package. The method also includes forming a conductive shield layer on the mold compound and sidewalls of the laminate substrate.

An integrated circuit (IC) package is described. The IC package includes a laminate substrate. The IC package also includes an active die on a surface of the laminate substrate. The IC package further includes means for dissipating heat along an additional heat dissipation path away from the surface of the laminate substrate proximate the active die.

This has outlined, rather broadly, the features and technical advantages of the present disclosure in order that the detailed description that follows may be better understood. Additional features and advantages of the present disclosure will be described below. It should be appreciated by those skilled in the art that this present disclosure may be readily utilized as a basis for modifying or designing other structures for carrying out the same purposes of the present disclosure. It should also be realized by those skilled in the art that such equivalent constructions do not depart from the teachings of the present disclosure as set forth in the appended claims. The novel features, which are believed to be characteristic of the present disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Figure 1:
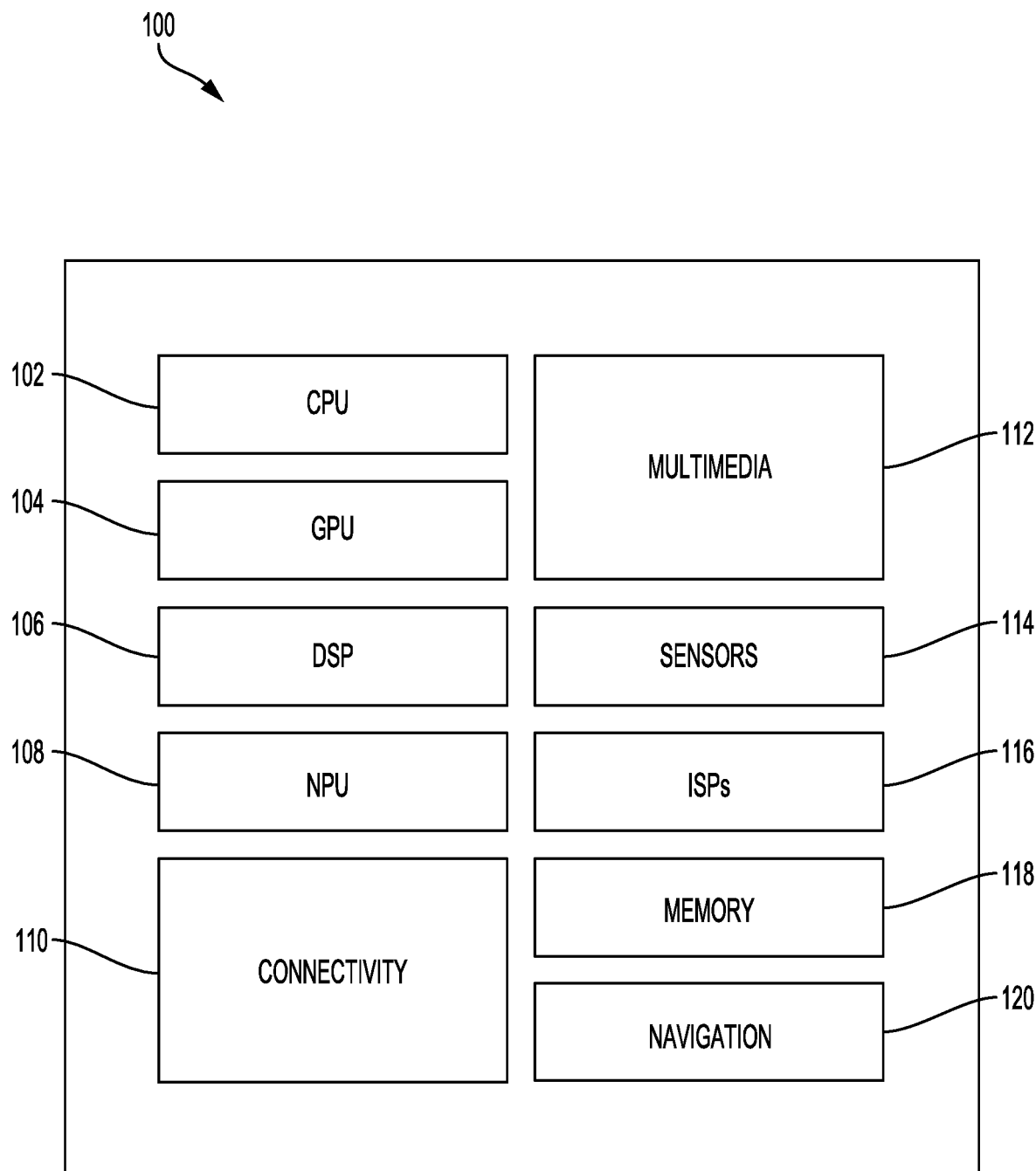
FIG. 1 illustrates an example implementation of a system-on-a-chip (SoC), including a symmetric heat distribution surface mount device, in accordance with certain aspects of the present disclosure.

The detailed description set forth below, in connection with the appended drawings, is intended as a description of various configurations and is not intended to represent the only configurations in which the concepts described may be practiced. The detailed description includes specific details for the purpose of providing a thorough understanding of the various concepts. It will be apparent, however, to those skilled in the art that these concepts may be practiced without these specific details. In some instances, well-known structures and components are shown in block diagram form in order to avoid obscuring such concepts.

As described, the use of the term "and/or" is intended to represent an "inclusive OR," and the use of the term "or" is intended to represent an "exclusive OR." As described, the term "exemplary" used throughout this description means "serving as an example, instance, or illustration," and should not necessarily be construed as preferred or advantageous over other exemplary configurations. As described, the term "coupled" used throughout this description means "connected, whether directly or indirectly through intervening connections (e.g., a switch), electrical, mechanical, or otherwise," and is not necessarily limited to physical connections. Additionally, the connections can be such that the objects are permanently connected or releasably connected. The connections can be through switches. As described, the term "proximate" used throughout this description means "adjacent, very near, next to, or close to." As described, the term "on" used throughout this description means "directly on" in some configurations, and "indirectly on" in other configurations.

Heat dissipation is increasingly problematic for high end chips that use die stacking, such as a complex system-on-a-chip (SoC) package. In particular, stacking two or more chips may lead to localized thermal hot spots. As the localized thermal hot spots are embedded in the stack-up, this may reduce the ability to cool the hot spots and achieve low junction temperatures. Conventional cooling solutions for achieving low junction temperatures include heat sinks, heat spreaders, and/or improved printed circuit boards. Conventional techniques of simply increasing the size of the heat spreader and/or the heat sink are impractical in small form factor devices (e.g., smartphones).

The design of complex SoC packages may be affected by communications enhancements, such as 5G communications. For example, an increased number of communication bands are specified for supporting 5G communications. Supporting these additional communication bands involves cramming additional devices in a reduced package size (e.g., a power amplifier module (PAM) package) resulting in high junction temperatures. Unfortunately, performance of complex SoC packages designed to support 5G communications may be detrimentally affected by high junction temperatures.

Various aspects of the disclosure provide a symmetric heat distribution surface mount device. The process flow for fabrication of the symmetric heat distribution surface mount device may include surface mount technology processes. It will be understood that the term "layer" includes film and is not construed as indicating a vertical or horizontal thickness unless otherwise stated. As described, the term "substrate" may refer to a substrate of a diced wafer or may refer to a substrate of a wafer that is not diced. As described, the term "laminate" may refer to a multilayer sheet to enable packaging of an IC device. The terms "substrate," "wafer," and "laminate" may be used interchangeably. Similarly, the terms "chip" and "die" may be used interchangeably.

Aspects of the present disclosure describe a symmetric heat distribution surface mount device in a package. In one aspect of the present disclosure, a fin-based surface mount device is placed in a power amplifier module (PAM) package. For example, fin-based surface mount devices are arranged on the surface of a laminate substrate to surround a power amplifier on the surface of the laminate substrate. The placement of the fin-based surface mount device on the surface of the laminate substrate achieves symmetric heat distribution by reducing junction temperatures to improve power amplifier performance.

FIG. 1 illustrates an example implementation of a host system-on-a-chip (SoC) 100, which includes a symmetric heat distribution surface mount device, in accordance with aspects of the present disclosure. The host SoC 100 includes processing blocks tailored to specific functions, such as a connectivity block 110. The connectivity block 110 may include fifth generation (5G) connectivity, fourth generation long term evolution (4G LTE) connectivity, Wi-Fi connectivity, USB connectivity, Bluetooth® connectivity, Secure Digital (SD) connectivity, and the like.

In this configuration, the host SoC 100 includes various processing units that support multi-threaded operation. For the configuration shown in FIG. 1, the host SoC 100 includes a multi-core central processing unit (CPU) 102, a graphics processor unit (GPU) 104, a digital signal processor (DSP) 106, and a neural processor unit (NPU) 108. The host SoC 100 may also include a sensor processor 114, image signal processors (ISPs) 116, a navigation module 120, which may include a global positioning system, and a memory 118. The multi-core CPU 102, the GPU 104, the DSP 106, the NPU 108, and the multi-media engine 112 support various functions such as video, audio, graphics, gaming, artificial networks, and the like. Each processor core of the multi-core CPU 102 may be a reduced instruction set computing (RISC) machine, an advanced RISC machine (ARM), a microprocessor, or some other type of processor. The NPU 108 may be based on an ARM instruction set.

Figure 2:
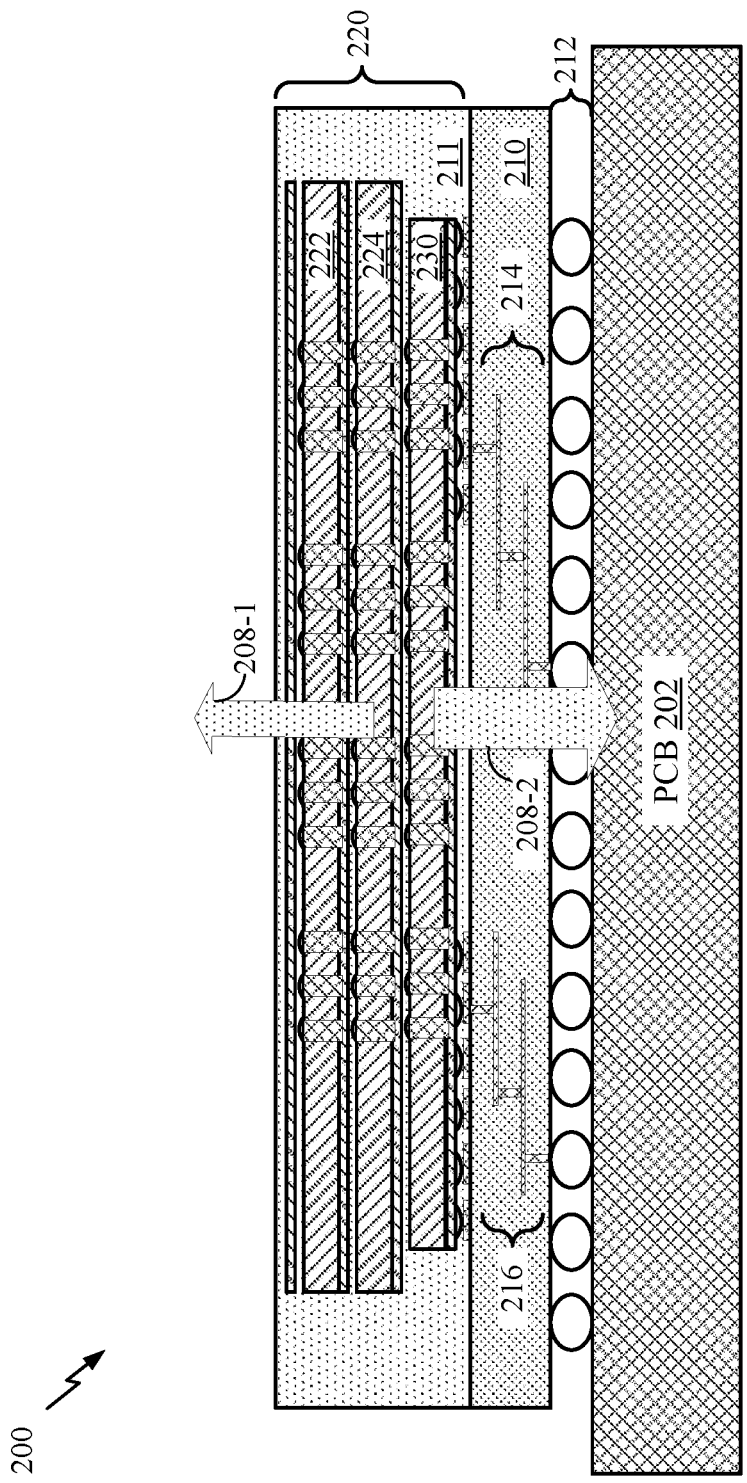
FIG. 2 shows a cross-sectional view illustrating the heat flow paths within a stacked integrated circuit (IC) package, including the SoC of FIG. 1.

FIG. 2 shows a cross-sectional view illustrating the main heat flow within a stacked integrated circuit (IC) package 200 of the SoC 100 of FIG. 1. Representatively, the stacked IC package 200 includes a printed circuit board (PCB) 202 connected to a package substrate 210 with interconnects 212. In this configuration, the package substrate 210 includes conductive layers 214 and 216. Above the package substrate 210 is a 3D chip stack 220, including stacked dies 222, 224, and 230, encapsulated by mold compound 211. In one aspect of the disclosure, the die 230 is the SoC of FIG. 1, including, for example, a power amplifier module (PAM) package, with stacked input/output (I/O) dies 222 and 224. As indicated by the arrows 208, heat is dissipated upward (208-1) and downward (208-2) from the active devices in the 3D chip stack 220. As shown in FIG. 2, a main heat flow path is indicated by downward arrow 208-2 and a secondary heat flow path is indicated by upward arrow 208-1.

Figure 3:
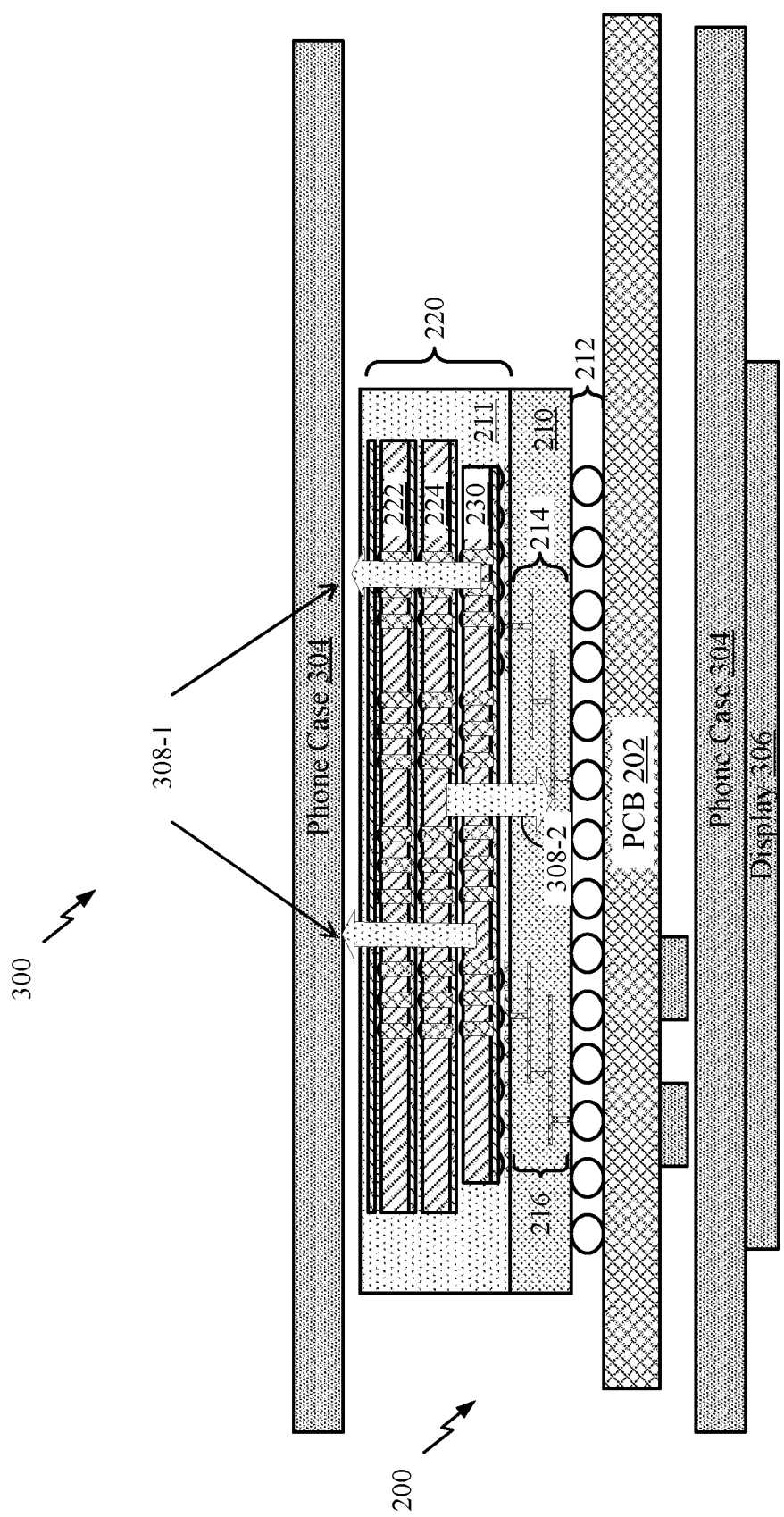
FIG. 3 shows a cross-sectional view illustrating the stacked IC package of FIG. 2, incorporated into a wireless device, according to one aspect of the disclosure.

FIG. 3 shows a cross-sectional view illustrating the stacked IC package 200 of FIG. 2, incorporated into a wireless device 300, according to one aspect of the present disclosure. As described, the wireless device 300 may include, but is not limited to, a smartphone, tablet, handheld device, or other limited form factor device configured for 5G communications. Representatively, the stacked IC package 200 is placed within a phone case 304, including a display 306. In this configuration, symmetric heat distribution surface mount devices (not shown) are integrated into the stacked IC package 200. As indicated by the arrows 308, heat is dissipated upwardly and downwardly from the active devices in the 3D chip stack 220. That is, heat is dissipated upwardly (308-1) and downwardly (308-2) from the active devices within the 3D chip stack 220. In this configuration, the symmetric heat distribution surface mount devices provide a heat flow path indicated by the arrows 308-1, to supplement the heat flow path as indicated by the downward arrow 308-2.

Figure 4A:
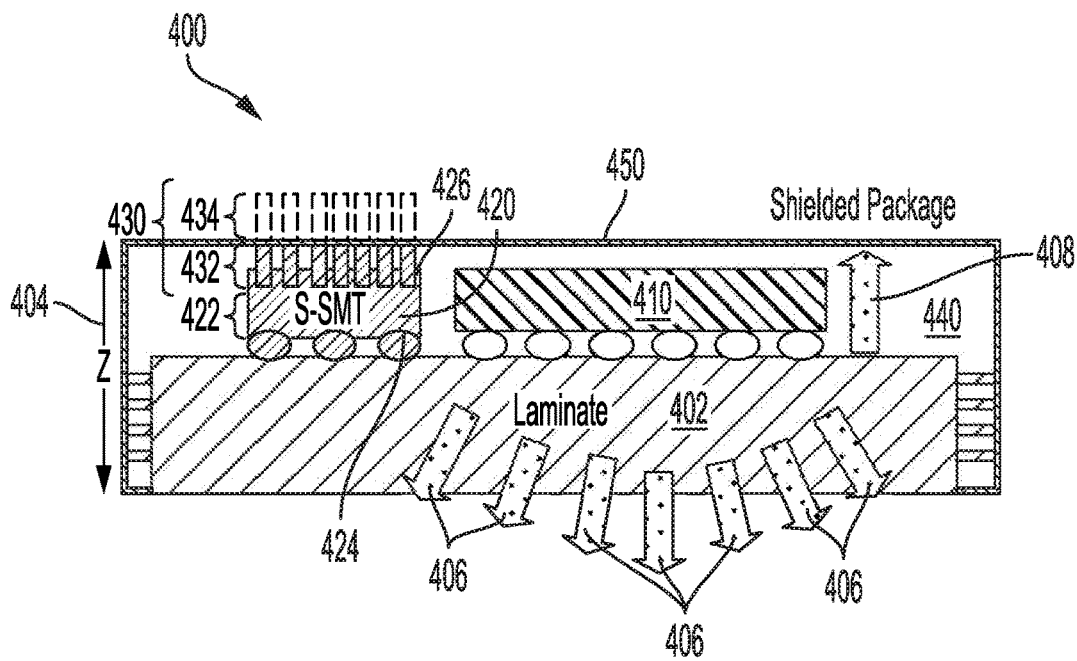
FIGS. 4A-4B are layout and cross-section diagrams illustrating a symmetric heat distribution surface mount device in a package, according to aspects of the present disclosure.
Figure 4B:
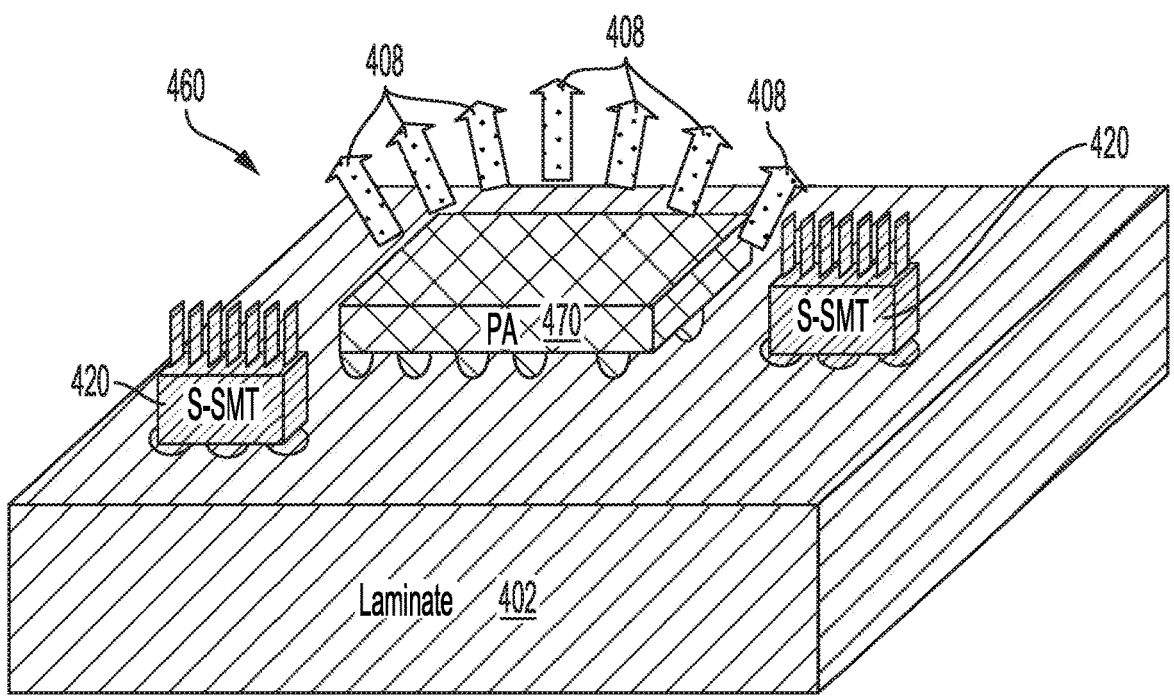

Aspects of the present disclosure are directed to a symmetric heat distribution surface mount device integrated in a package, for example, as shown in FIGS. 4A-4B. Although described with reference to a power amplifier module (PAM) package, it should be recognized that the symmetric heat distribution surface mount device may be incorporated into any chip package in which improved heat distribution is desired.

FIGS. 4A-4B are layout and cross-section diagrams illustrating a symmetric heat distribution surface mount device in a package, according to aspects of the present disclosure.

FIG. 4A is a cross-section diagram of a shielded package 400, having a fin-based thermal surface mount device 420 proximate an active die 410, according to aspects of the present disclosure. In this configuration, the shielded package 400 includes a laminate substrate 402 (e.g., a multilayer substrate including a ground plane). The shielded package 400 also includes an active die 410 on a surface of the laminate substrate 402. The shielded package 400 further includes a conductive shield layer 450. According to aspects of the present disclosure, the active die 410 may be a high power active die, such as a server die, a radio frequency (RF) die, a mobile station modem, or other like high power active device. The shielded package 400 further includes a fin-based thermal surface mount device 420 on the surface of the laminate substrate 402 and proximate the active die 410 to provide symmetric thermal dissipation paths 408.

Design of the laminate substrate 402 is generally optimized for downward thermal dissipation shown by the conventional heat dissipation paths 406, which increase junction temperatures leading to decreased performance. According to aspects of the present disclosure, placement of the fin-based thermal surface mount devices 420 in vacant areas on the surface of the laminate substrate creates the symmetric thermal dissipation paths 408. One of the symmetric thermal dissipation paths 408 is in a direction opposite to the conventional heat dissipation paths 406. In this configuration, the fin-based thermal surface mount device 420 is composed of a thermal body 422, having a first side 424 on the surface of the laminate substrate 402. The thermal body 422 may be composed of a thermal material such as copper (Cu) or other like thermal material to operate as a heat sink. In this example, the first side 424 of the thermal body 422 is secured to the surface of the laminate substrate 402 using a surface mount technology.

As further shown in FIG. 4A, the fin-based thermal surface mount device 420 includes thermal fins 430 (e.g., copper) coupled to a second side 426 of the thermal body 422 distal from the first side 424 of the thermal body 422 and the surface of the laminate substrate 402. A fin pattern and height of the thermal fins 430 may be adjusted as desired to form the symmetric thermal dissipation paths 408. In addition, a pattern of the thermal fins 430 may be selected to enable pick and place (PnP) surface mount technology (SMT) attachment of the fin-based thermal surface mount device 420 to the surface of the laminate substrate 402. Nevertheless, a height of the thermal fins 430 is limited by a Z-height 404 of the shielded package 400. In this configuration, the height of the thermal fins 430 is reduced during a fabrication process to avoid exceeding the Z-height 404 of the shielded package 400 by etching a top portion 434 of the thermal fins 430, such that the thermal fins 430 are composed of a bottom portion 432. A height of the thermal fins 430 may be in the range of twenty-five (25) microns to two-hundred (200) microns. The Z-height 404 of the shielded package 400 may be in the range of twenty-five (25) microns to two-hundred (300) microns.

FIG. 4B is a layout diagram of a power amplifier module (PAM) package 460, having fin-based thermal surface mount devices 420 proximate a power amplifier module 470, according to aspects of the present disclosure. In this example, the fin-based thermal surface mount devices 420 are arranged on the surface of the laminate substrate 402 to generate the symmetric thermal dissipation paths 408. The symmetric thermal dissipation paths 408 reduce thermal junction temperatures to enable use of the power amplifier module 470 in 5G communications applications. A process for fabricating the PAM package 460 is shown in FIGS. 6A-6C.

Figure 5A:
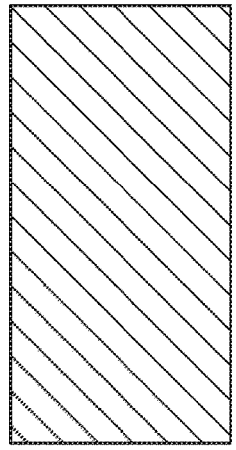
FIGS. 5A-5D illustrate various shape configurations of a symmetric heat distribution surface mount device, according to aspects of the present disclosure.
Figure 5B:
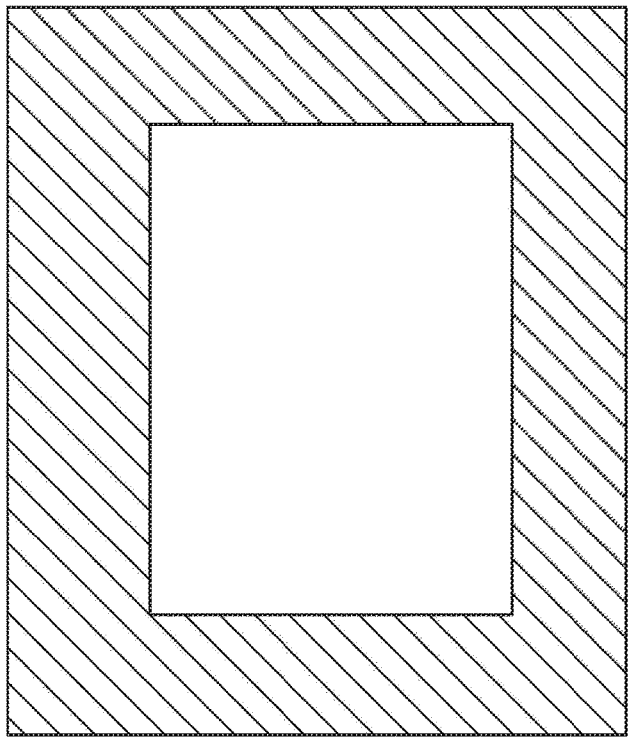
Figure 5C:
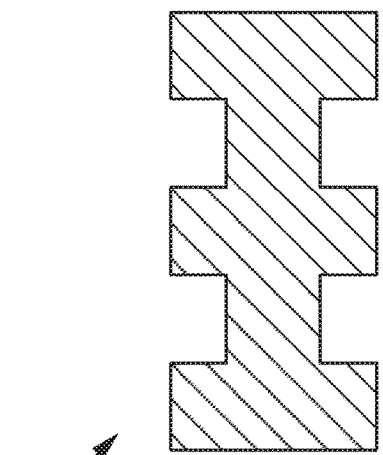
Figure 5D:

FIGS. 5A-5D illustrate various shape configurations of a fin-based thermal surface mount device, according to aspects of the present disclosure. In FIG. 5A, a top view of a fin-based thermal surface mount device 500 is shown in a rectangular shape. In FIG. 5B, a top view of a fin-based thermal surface mount device 510 is shown in a square shape to surround an active die (not shown) when a vacant area is available on the surface of the laminate substrate 402. In FIG. 5C, a side view of a fin-based thermal surface mount device 520 is shown with fins on the top and bottom of the fin-based thermal surface mount device 520. This configuration may be used to adjust a contact surface area of the fin-based thermal surface mount device 520. In FIG. 5D, a side view of a fin-based thermal surface mount device 530 is shown in a rectangular shape. Although various shapes are shown, placement and shape of the thermal surface mount devices will depend on shapes of the vacant areas available on the surface of the laminate substrate 402.

Figure 6A:
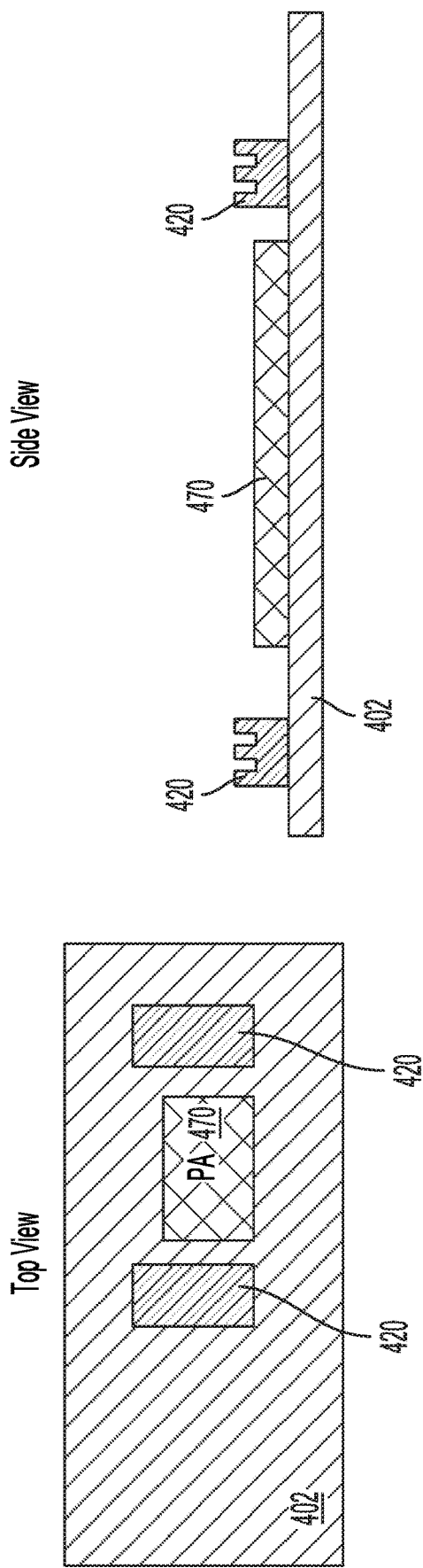
FIG. 6A-6C are schematic diagrams illustrating a process of fabricating the symmetric heat distribution surface mount device in the package of FIG. 4B, according to aspects of the present disclosure.
Figure 6B:
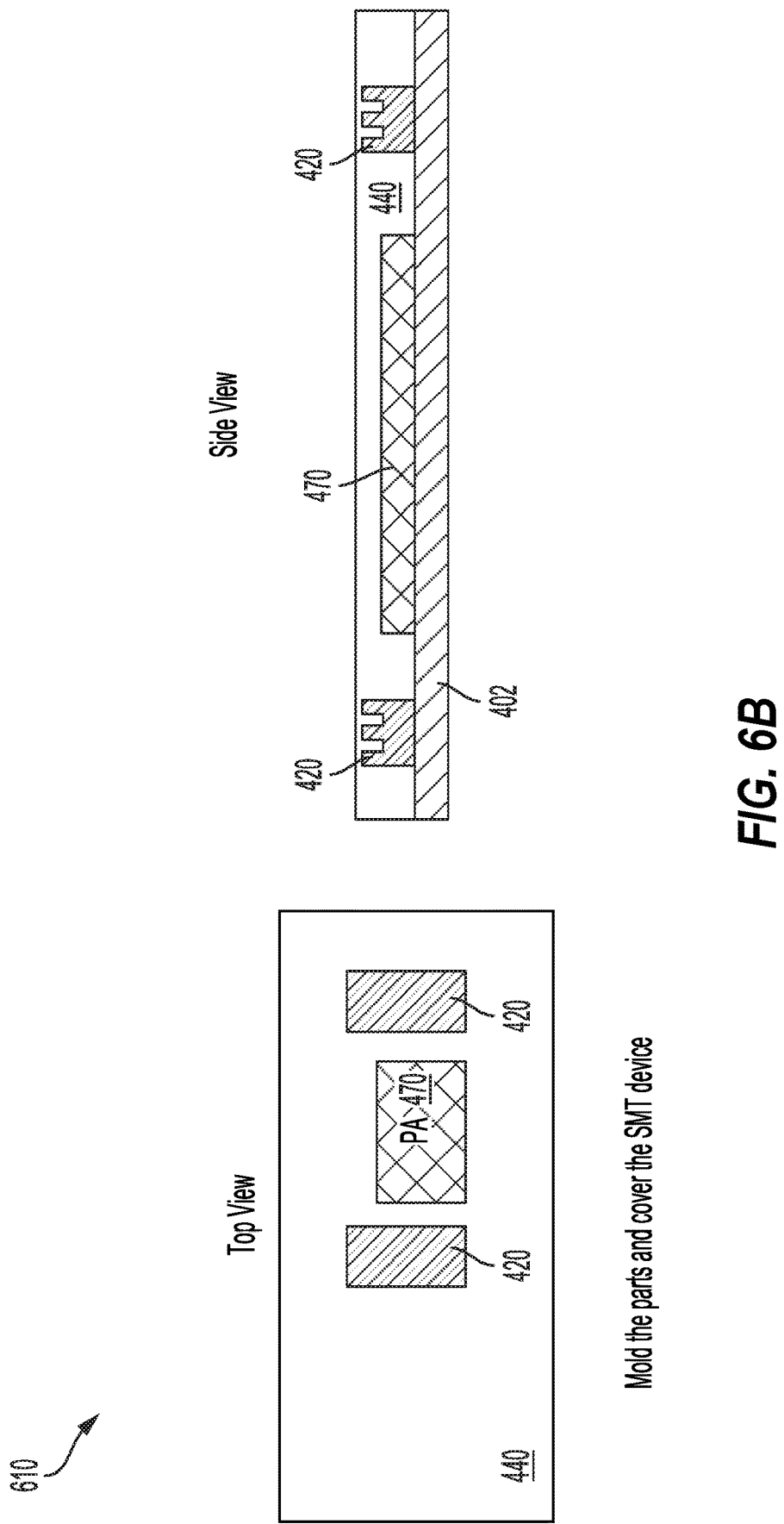
Figure 6C:
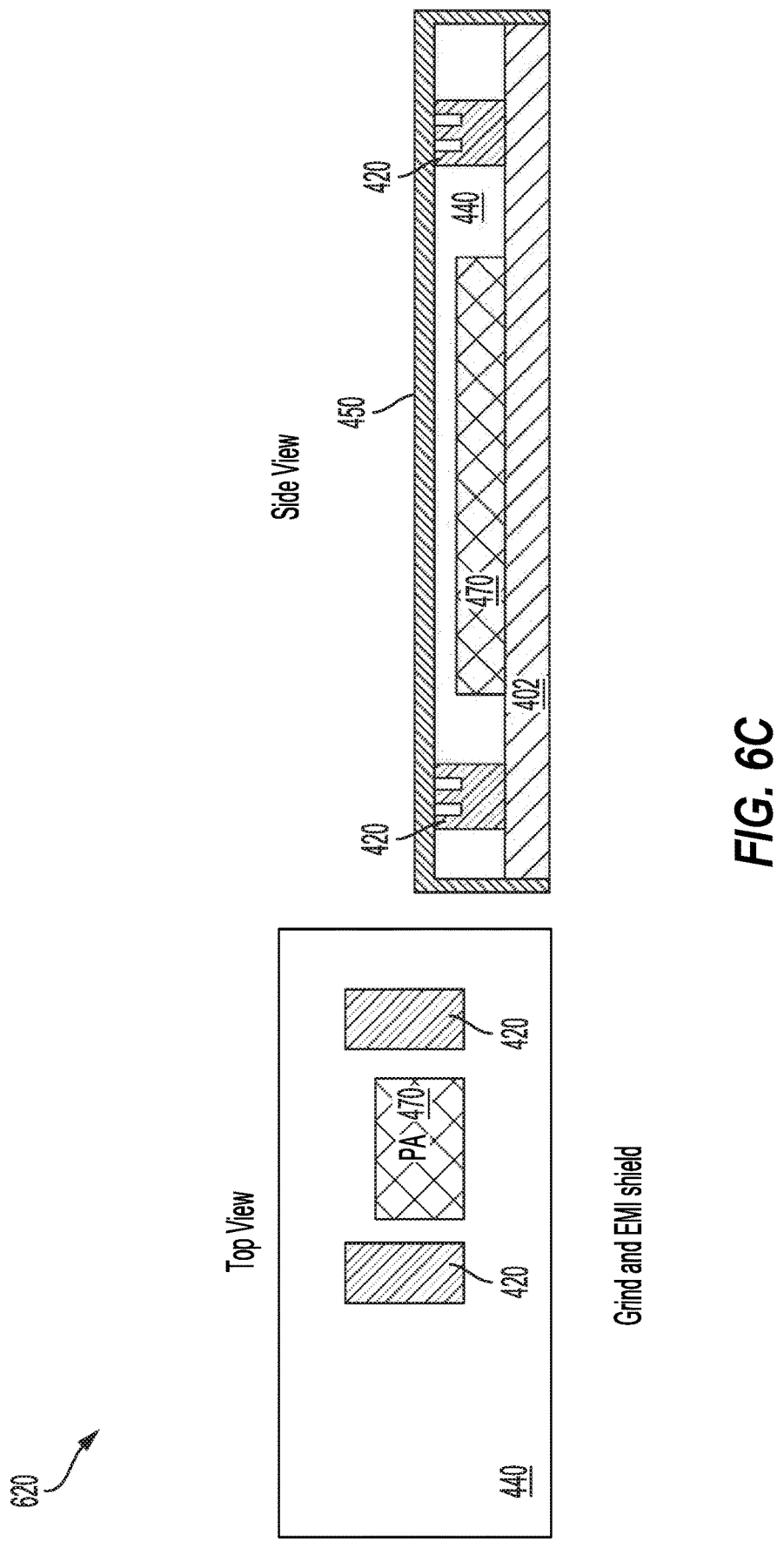

FIGS. 6A-6C are schematic diagrams illustrating a process of fabricating the symmetric heat distribution surface mount device in the package of FIG. 4B, according to aspects of the present disclosure. Although two of the fin-based thermal surface mount devices 420 are shown in FIGS. 6A-6C, it should be recognized that any number of the fin-based thermal surface mount devices 420 may be used depending on the desired application, such as the type of the power amplifier module (PAM) package.

As shown in FIG. 6A, at step 600, the fin-based thermal surface mount devices 420 are attached to vacant areas on a surface of the laminate substrate 402 proximate the power amplifier module 470. The fin-based thermal surface mount devices 420 may be attached to the surface of the laminate substrate 402 using a die attach material (e.g., Henkel 8068 TB V3) or a paste attachment (e.g., SAC 305 paste), depending on the type of the power amplifier module 470. As shown in FIG. 6B, at step 610, a mold compound 440 (e.g., filled epoxy resin such as Sumitomo G311Q-L) is deposited on the surface of the laminate substrate 402, the power amplifier module 470, and the fin-based thermal surface mount devices 420. As shown in FIG. 6C, at step 620, a conductive shield layer 450 is formed on the mold compound 440 and sidewalls of the laminate substrate 402.

Figure 7:
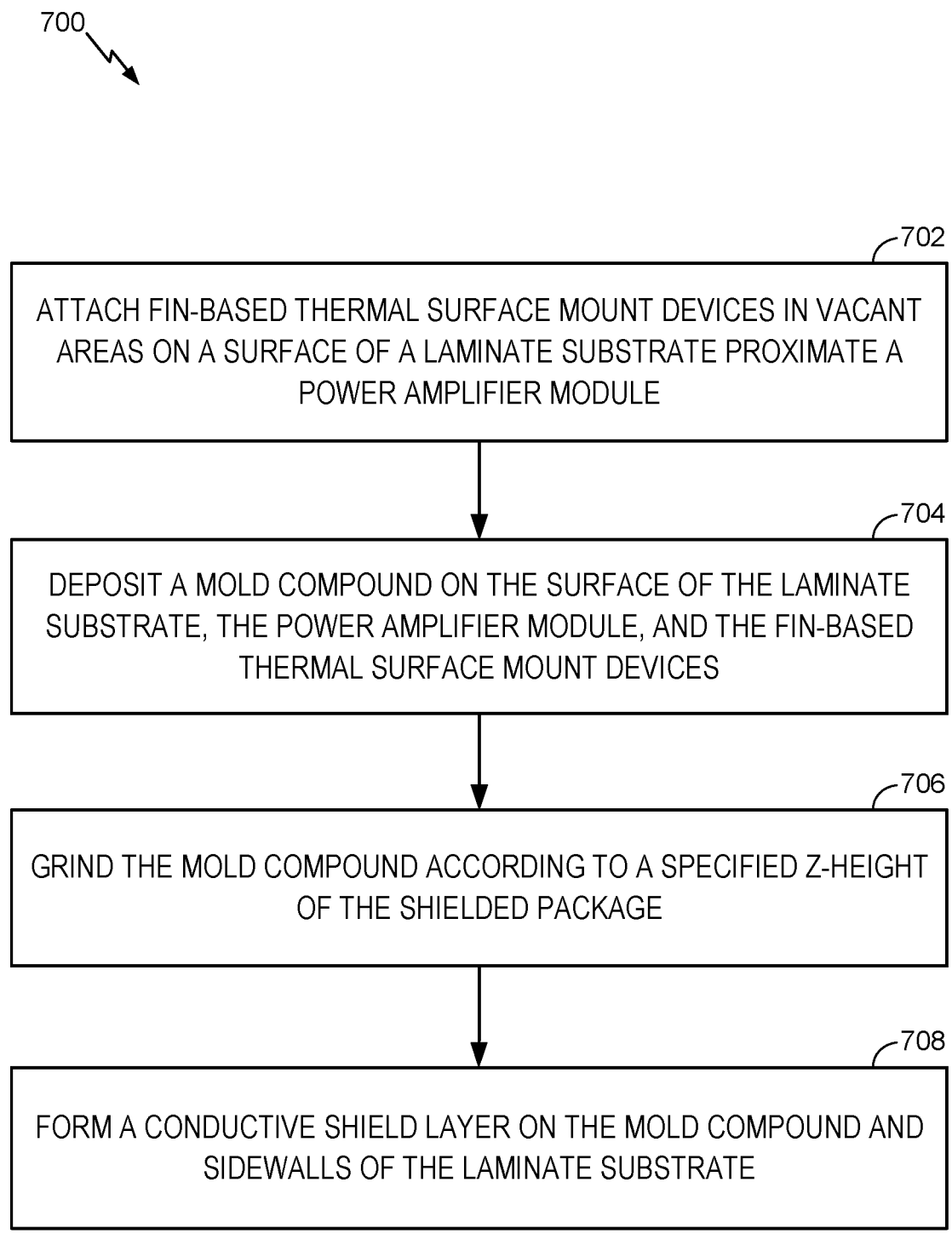
FIG. 7 is a process flow diagram illustrating a method for fabricating a symmetric heat distribution surface mount device in a shielded package, according to an aspect of the present disclosure.

FIG. 7 is a process flow diagram illustrating a method for fabricating symmetric heat distribution thermal surface mount devices in a shielded package, according to an aspect of the present disclosure. A method 700 begins in block 702, in which fin-based thermal surface mount devices are attached in vacant areas on a surface of a laminate substrate proximate a power amplifier module. For example, as shown in FIG. 6A, the fin-based thermal surface mount devices 420 are attached to a surface of the laminate substrate 402 proximate the power amplifier module 470. At block 704, a mold compound is deposited on the surface of the laminate substrate, the power amplifier module, and the fin-based thermal surface mount devices. For example, as shown in FIG. 6B, the mold compound 440 is deposited on the surface of the laminate substrate 402, the power amplifier module 470, and the fin-based thermal surface mount devices 420.

At block 706, the mold compound is grinded according to a specified Z-height of the shielded package. For example, as shown in FIG. 4A, the height of the thermal fins 430 is limited by the Z-height 404 of the shielded package 400. As described in FIG. 6C, the height of the thermal fins 430 is reduced by etching the top portion 434 and leaving the bottom portion 432 of the thermal fins 430 during a fabrication process to avoid exceeding the Z-height 404 of the shielded package 400, as shown in FIG. 4A.

At block 708, a conductive shield layer is formed on the mold compound and sidewalls of the laminate substrate. For example, in FIG. 6C, a conductive shield layer 450 is formed on the mold compound 440 and sidewalls of the laminate substrate 402. The method 700 also includes exposing portions of the fins of the fin-based thermal surface mount devices from the grinding of the mold compound. Once exposed, the method 700 also includes depositing a conductive material on the mold compound and the exposed portions of the fins of the fin-based thermal surface mount devices.

According to a further aspect of the present disclosure, an integrated circuit (IC) includes a fin-based thermal surface mount device. In one configuration, the IC has means for means for dissipating heat along an additional heat dissipation path away from the surface of the laminate substrate proximate the active die. In one configuration, the heat dissipating means may be the fin-based thermal surface mount device 420, as shown in FIGS. 4A-6C. In another aspect, the aforementioned means may be any structure or any material configured to perform the functions recited by the aforementioned means. (Completed after claim language approval).

Figure 8:
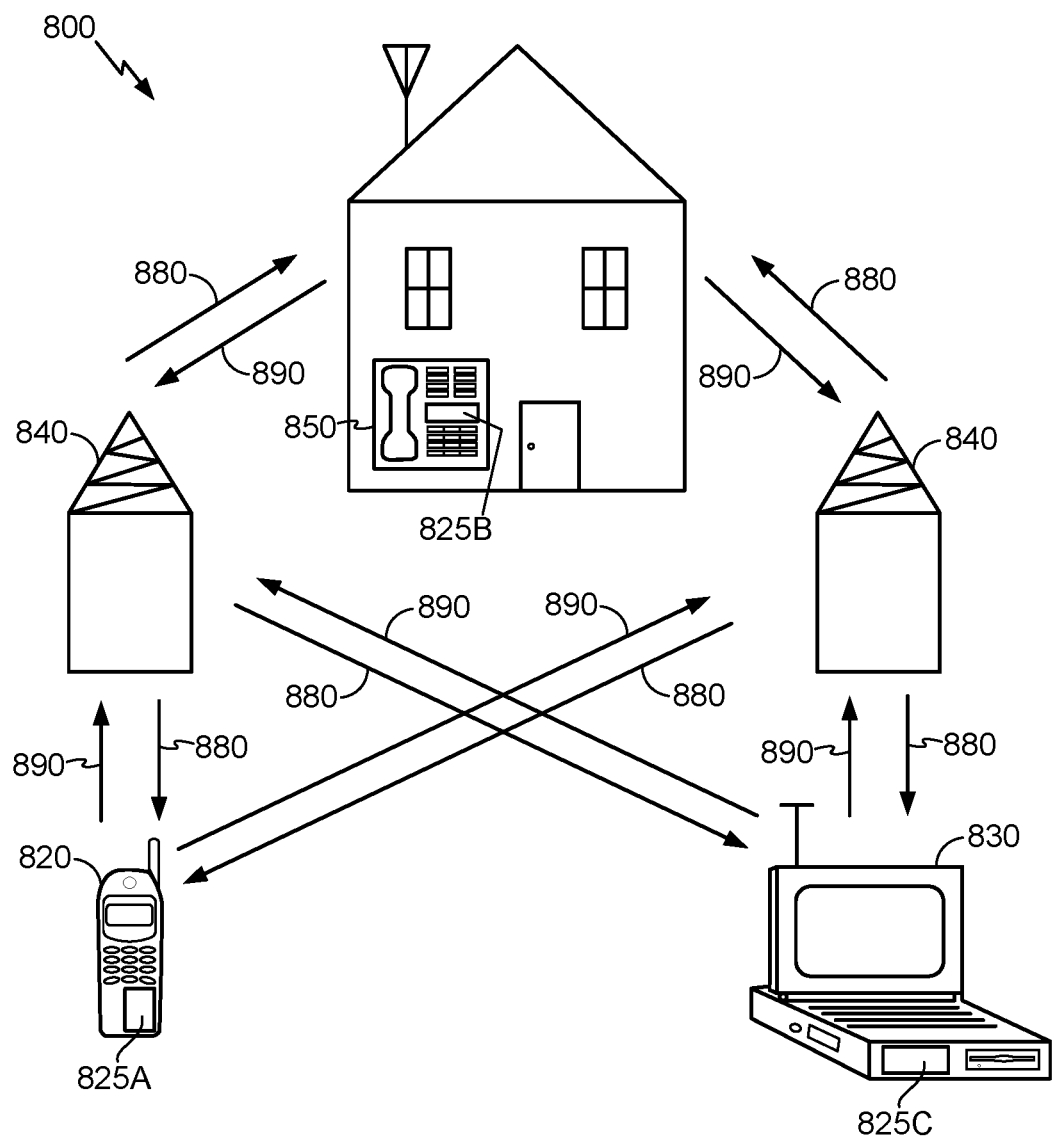
FIG. 8 is a block diagram showing an exemplary wireless communications system in which a configuration of the disclosure may be advantageously employed.

FIG. 8 is a block diagram showing an exemplary wireless communications system 800 in which an aspect of the disclosure may be advantageously employed. For purposes of illustration, FIG. 8 shows three remote units 820, 830, and 850, and two base stations 840. It will be recognized that wireless communications systems may have many more remote units and base stations. Remote units 820, 830, and 850 include IC devices 825A, 825C, and 825B that include the disclosed fin-based thermal surface mount device. It will be recognized that other devices may also include the disclosed fin-based thermal surface mount device, such as the base stations, switching devices, and network equipment. FIG. 8 shows forward link signals 880 from the base station 840 to the remote units 820, 830, and 850, and reverse link signals 890 from the remote units 820, 830, and 850 to base stations 840.

In FIG. 8, remote unit 820 is shown as a mobile telephone, remote unit 830 is shown as a portable computer, and remote unit 850 is shown as a fixed location remote unit in a wireless local loop system. For example, the remote units may be a mobile phone, a hand-held personal communications systems (PCS) unit, a portable data unit, such as a personal data assistant, a GPS enabled device, a navigation device, a set top box, a music player, a video player, an entertainment unit, a fixed location data unit, such as meter reading equipment, or other device that stores or retrieves data or computer instructions, or combinations thereof. Although FIG. 8 illustrates remote units according to the aspects of the present disclosure, the disclosure is not limited to these exemplary illustrated units. Aspects of the present disclosure may be suitably employed in many devices, which include the disclosed fin-based thermal surface mount device.

Figure 9:
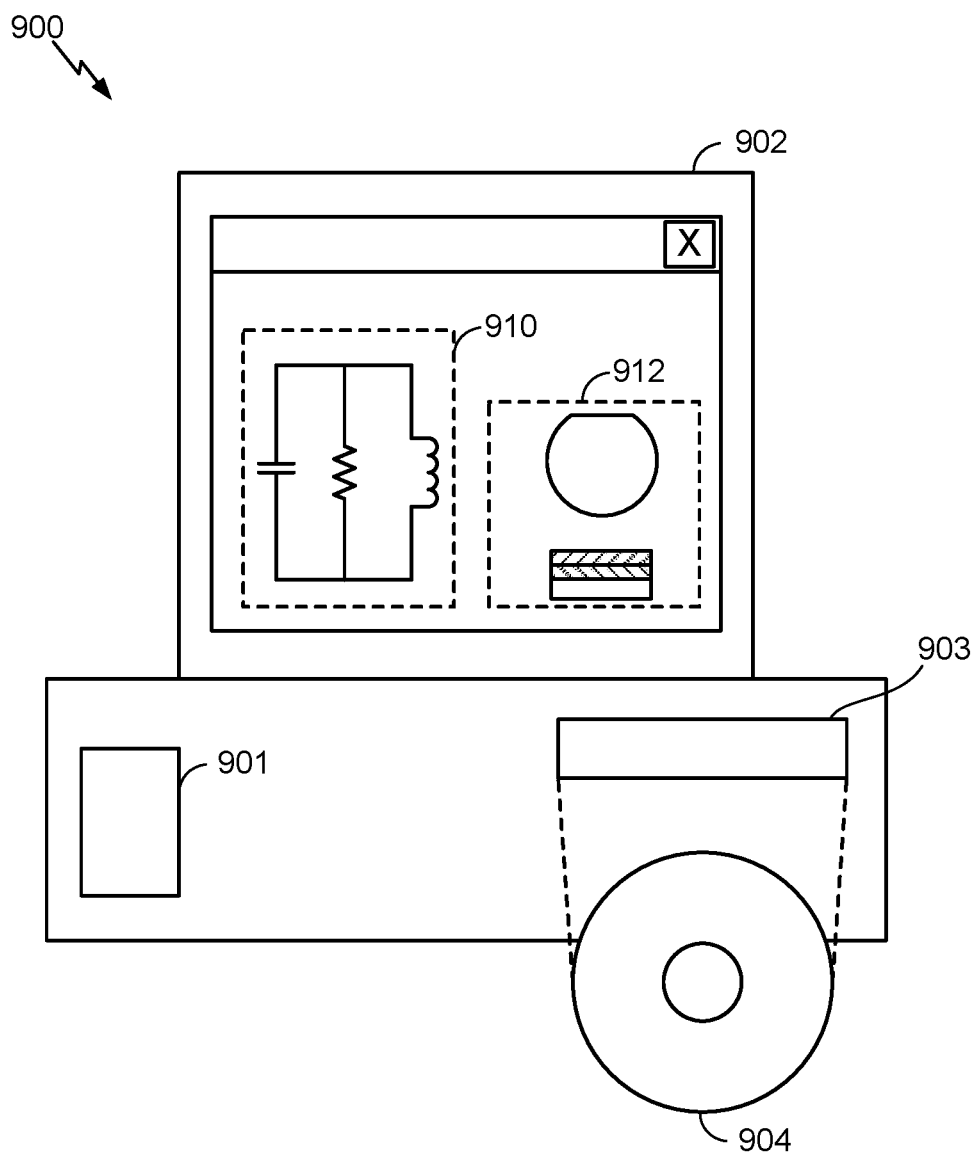
FIG. 9 is a block diagram illustrating a design workstation used for circuit, layout, and logic design of a semiconductor component according to one configuration.

FIG. 9 is a block diagram illustrating a design workstation used for circuit, layout, and logic design of a semiconductor component, such as the capacitors disclosed above. A design workstation 900 includes a hard disk 901 containing operating system software, support files, and design software such as Cadence or OrCAD. The design workstation 900 also includes a display 902 to facilitate design of a circuit 910 or an RF component 912 such as a fin-based thermal surface mount device. A storage medium 904 is provided for tangibly storing the design of the circuit 910 or the RF component 912 (e.g., the fin-based thermal surface mount device). The design of the circuit 910 or the RF component 912 may be stored on the storage medium 904 in a file format such as GDSII or GERBER. The storage medium 904 may be a CD-ROM, DVD, hard disk, flash memory, or other appropriate device. Furthermore, the design workstation 900 includes a drive apparatus 903 for accepting input from or writing output to the storage medium 904.

Data recorded on the storage medium 904 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 904 facilitates the design of the circuit 910 or the RF component 912 by decreasing the number of processes for designing semiconductor wafers.

For a firmware and/or software implementation, the methodologies may be implemented with modules (e.g., procedures, functions, and so on) that perform the functions described. A machine-readable medium tangibly embodying instructions may be used in implementing the methodologies described. For example, software codes may be stored in a memory and executed by a processor unit. Memory may be implemented within the processor unit or external to the processor unit. As used herein, the term "memory" refers to types of long term, short term, volatile, nonvolatile, or other memory and is not limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer. Disk and disc, as used herein, include compact disc (CD), laser disc, optical disc, digital versatile disc (DVD), floppy disk, and Blu-ray® disc, where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communications apparatus. For example, a communications apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions, and alterations can be made without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

Those of skill would further appreciate that the various illustrative logical blocks, modules, circuits, and algorithm steps described in connection with the disclosure may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure may be implemented or performed with a general-purpose processor, a digital signal processor (DSP), an application-specific integrated circuit (ASIC), a field-programmable gate array (FPGA) or other programmable logic device, discrete gate or transistor logic, discrete hardware components, or any combination thereof designed to perform the functions described. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, multiple microprocessors, one or more microprocessors in conjunction with a DSP core, or any other such configuration.

The steps of a method or algorithm described in connection with the present disclosure may be embodied directly in hardware, in a software module executed by a processor, or in a combination of the two. A software module may reside in RAM, flash memory, ROM, EPROM, EEPROM, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

The previous description of the disclosure is provided to enable any person skilled in the art to make or use the disclosure. Various modifications to the disclosure will be readily apparent to those skilled in the art, and the generic principles defined may be applied to other variations without departing from the spirit or scope of the disclosure. Thus, the disclosure is not intended to be limited to the examples and designs described but is to be accorded the widest scope consistent with the principles and novel features disclosed.

What is claimed is:

1. An integrated circuit (IC) package, comprising:
   a laminate substrate;
   an active die on a surface of the laminate substrate;
   a plurality of fin-based thermal surface mount devices on the surface of the laminate substrate proximate the active die to provide an additional heat dissipation path;
   a mold compound on the surface of the laminate substrate, the active die, and the fin-based surface mount devices; and
   a conductive shield layer on the mold compound and sidewalls of the laminate substrate.

2. The IC package of claim 1, in which the plurality of the fin-based thermal surface mount devices comprise:
   a thermal body having a first side on the surface of the laminate substrate; and
   a plurality of thermal fins coupled to a second side of the thermal body being distal from the first side of the thermal body and the surface of the laminate substrate.

3. The IC package of claim 1, in which a pattern of the plurality of thermal fins is selected to enable pick and place (PnP) surface mount technology (SMT) attachment of the plurality of the fin-based thermal surface mount devices to the surface of the laminate substrate.

4. The IC package of claim 1, in which the active die comprises a power amplifier and the IC package comprises a power amplifier module (PAM) package.

5. The IC package of claim 1, in which the active die comprises a server die.

6. The IC package of claim 1, in which the active die comprises a radio frequency (RF) die.

7. The IC package of claim 1, in which the conductive shield layer comprises an electromagnetic interference (EMI) shield coupled to a ground plane of the laminate substrate.

8. The IC package of claim 1, in which a height of the plurality of the fin-based thermal surface mount devices is a less than a Z-height of the conductive shield layer.

9. A method for fabricating symmetric heat distribution thermal surface mount devices in a shielded package, comprising:
   attaching a plurality of fin-based thermal surface mount devices in vacant areas on a surface of a laminate substrate proximate a power amplifier module;
   depositing a mold compound on the surface of the laminate substrate, the power amplifier module, and the fin-based thermal surface mount devices;
   grinding the mold compound according to a specified Z-height of the shielded package; and
   forming a conductive shield layer on the mold compound and sidewalls of the laminate substrate.

10. The method of claim 9, in which forming the conductive shield layer comprises:
 exposing portions of thermal fins of the plurality of the fin-based thermal surface mount devices from the grinding of the mold compound; and
 depositing a conductive material on the mold compound and exposed portions of the thermal fins of the plurality of the fin-based thermal surface mount devices.

11. The method of claim 9, in which attaching the plurality of fin-based thermal surface mount devices comprises selecting a pattern of the plurality of thermal fins is selected to enable pick and place (PnP) surface mount technology (SMT) attachment of the plurality of the fin-based thermal surface mount devices to the surface of the laminate substrate.

12. The method of claim 9, in which forming the conductive shield layer comprises forming an electromagnetic interference (EMI) shield coupled to a ground plane of the laminate substrate.

13. The method of claim 9, in which a height of the plurality of the fin-based thermal surface mount devices is a less than the specified Z-height of the conductive shield layer.

14. An integrated circuit (IC) package, comprising:
 a laminate substrate;
 an active die on a surface of the laminate substrate;
 means for dissipating heat along an additional heat dissipation path away from the surface of the laminate substrate proximate the active die;
 a mold compound on the surface of the laminate substrate, the active die, and the heat dissipating means; and
 a conductive shield layer on the mold compound and sidewalls of the laminate substrate.

15. The IC package of claim 14, in which the active die comprises a power amplifier and the IC package comprises a power amplifier module (PAM) package.

16. The IC package of claim 14, in which the active die comprises a server die.

17. The IC package of claim 14, in which the active die comprises a radio frequency (RF) die.

18. The IC package of claim 14, in which the conductive shield layer comprises an electromagnetic interference (EMI) shield coupled to a ground plane of the laminate substrate.

\* \* \* \* \*